United States Patent

Göras et al.

[11] Patent Number: 5,907,243
[45] Date of Patent: May 25, 1999

[54] MEASURING CIRCUIT FOR SENSING IONISATION WITHIN A CYLINDER OF A COMBUSTION ENGINE

[75] Inventors: Anders Göras; Gunnar Björquist, both of ÅmÅl, Sweden

[73] Assignee: MECEL AB, Sweden

[21] Appl. No.: 08/913,741

[22] PCT Filed: Jan. 21, 1997

[86] PCT No.: PCT/SE97/00087

§ 371 Date: Sep. 23, 1997

§ 102(e) Date: Sep. 23, 1997

[87] PCT Pub. No.: WO97/27400

PCT Pub. Date: Jul. 31, 1997

[30] Foreign Application Priority Data

Jan. 23, 1996 [SE] Sweden .................................. 9600271

[51] Int. Cl.[6] .............................. F02P 17/00; G01M 15/00
[52] U.S. Cl. ............................ 324/388; 324/399; 73/116; 123/435
[58] Field of Search .................................. 324/378, 380, 324/388, 391, 393, 399, 459, 460; 73/116, 117.3, 35.08; 123/435, 479

[56] References Cited

U.S. PATENT DOCUMENTS

| | | | |
|---|---|---|---|
| 4,359,893 | 11/1982 | Kizler et al. | 324/460 |
| 5,087,882 | 2/1992 | Iwata | 324/388 |
| 5,207,200 | 5/1993 | Iwata | 123/425 |
| 5,271,268 | 12/1993 | Ikeuchi et al. | 73/115 |
| 5,396,176 | 3/1995 | Ishii et al. | 324/388 |
| 5,444,375 | 8/1995 | Ohsawa et al. | 324/399 |
| 5,769,049 | 6/1998 | Nytomt et al. | 123/435 |

FOREIGN PATENT DOCUMENTS 4-191465 7/1992 Japan ....................................... 324/382

*Primary Examiner*—Diep N. Do
*Attorney, Agent, or Firm*—Ostrolenk, Faber, Gerb & Soffen, LLP

[57] ABSTRACT

A measuring circuit for sensing ionization within a combustion chamber of an engine is arranged in the grounded end of the secondary winding (5) of an ignition coil (2), and includes a voltage source for measurements having a substantially constant potential. The voltage source for measurements used is a capacitor 13 which is charged by the spark current SC, and subsequently after the ignition spark goes out will apply a bias voltage over the spark plug gap 3 with a reversed polarity in relation to the spark voltage. The ionisation within the combustion chamber is detected with a measuring resistance 14 arranged in series with the capacitor 13. A rectifying element 11 is connected in parallel with the measuring resistance, which will secure that the spark current is developed in the spark plug gap 4 and that the measurement current passes through the measuring resistance 14. The rectifying element is grounded with a separated ground strap which does not pass the ground plane of the measuring resistance. The interference inducing spark current may then be conducted in a separated circuit without having to pass the ground plane used for the remaining electronic components of the circuitry.

11 Claims, 2 Drawing Sheets

MEASURING CIRCUIT FOR SENSING IONISATION WITHIN A CYLINDER OF A COMBUSTION ENGINE

BACKGROUND OF THE INVENTION

The present invention relates to a measuring circuit for sensing ionisation within a cylinder of a combustion engine, where the combustion is initiated with a spark plug.

STATE OF THE ART

In U.S. Pat. No. 4,648,367, a measuring circuit for sensing ionisation in a Otto-engine is shown. By the application of a substantially constant bias voltage in the grounded connection of the secondary winding of the ignition coil, the ionisation within the combustion chamber may be detected. The detection is obtained via a measuring resistance connected in series between a capacitor and ground, which measuring resistance is protected by a diode connected in parallel. The diode will by-pass the spark current and the measuring capacitance and will promote a current, i.e. the ionisation current, via the spark plug gap.

In U.S. Pat. No. 5,271,268, the same concept is patented. In a preferred embodiment, the induced voltage in the secondary winding is used as a source for charging the measuring capacitor to a substantial constant measuring voltage.

In both of these solutions, the spark current will be conducted to a ground connection also used for the measuring resistance. The spark current is in the order of some 100 m Ampere, and the ionisation current only reaches an order of some µAmpere. In order to be able to detect the ionisation current in a reliable manner, the detection should be made as close to the measuring resistance as possible, and the electronic circuitry should be designed with sufficient sensitivity in order to detect the relatively low order of variations in the ionisation current. If for example the measuring signal at the output 6 in above mentioned U.S. Pat. No. 5,271,268 should be forwarded to a central processor located at a protected location in the engine compartment, possibly the firewall or inside the passenger compartment, then there is a risk that the signal is subject to interference. The signal processing is thus usually handled as close as possible to the measuring resistance. Integration of signal processing circuitry with the ignition coil has been designed in the customary fashion with protective diodes and measuring resistance integrated on the same circuit board having a common ground connection. Another disadvantage is that the primary current developed in the primary winding of the ignition coil in most cases is conducted via the engine casing and a ground strap back to battery ground, which results in an extended primary current circuit with a large physical area. The Primary circuit will then become extremely susceptible to electromagnetic interference from other units, and will itself emit interference of a high order. Emitted interference could then affect other systems and interference received could distort ion current measurements.

SUMMARY OF THE INVENTION

One object of the invention is that measuring circuits used for sensing ion currents control spark currents such that the electronic circuitry used for sensing ion currents would not be affected by the spark currents.

Another object is that the parts of the ignition system in a convenient manner could be designed such that the electromagnetic interference emitted from the ignition system could be reduced.

Yet another object with a further developed embodiment is that the spark current and the primary current are divided into two physically separated electric circuits, both designed with a limited physical size. The electric circuits could then be designed with a low susceptibility for external interference which in itself will reduce emitted interference.

The foregoing and other objects are accomplished in accordance with the present invention by a measuring circuit which includes a measuring resistance, a rectifying element in parallel with the measuring resistance and a measuring voltage source, wherein the rectifier element is connected directly to engine ground without passing through the ground plane of the measuring circuit.

By the inventive measuring circuit may the spark current be restricted to a clearly defined electric circuit, not including the electronic circuitry, and the spark current causing a high order of interference may be separated from sensitive components of the circuitry.

Other features and advantages of the present invention will become apparent from the following description of the invention which refers to the accompanying drawings.

DETAILED DESCRIPTION OF PREFERRED EMBODIMENTS

Figure 1:
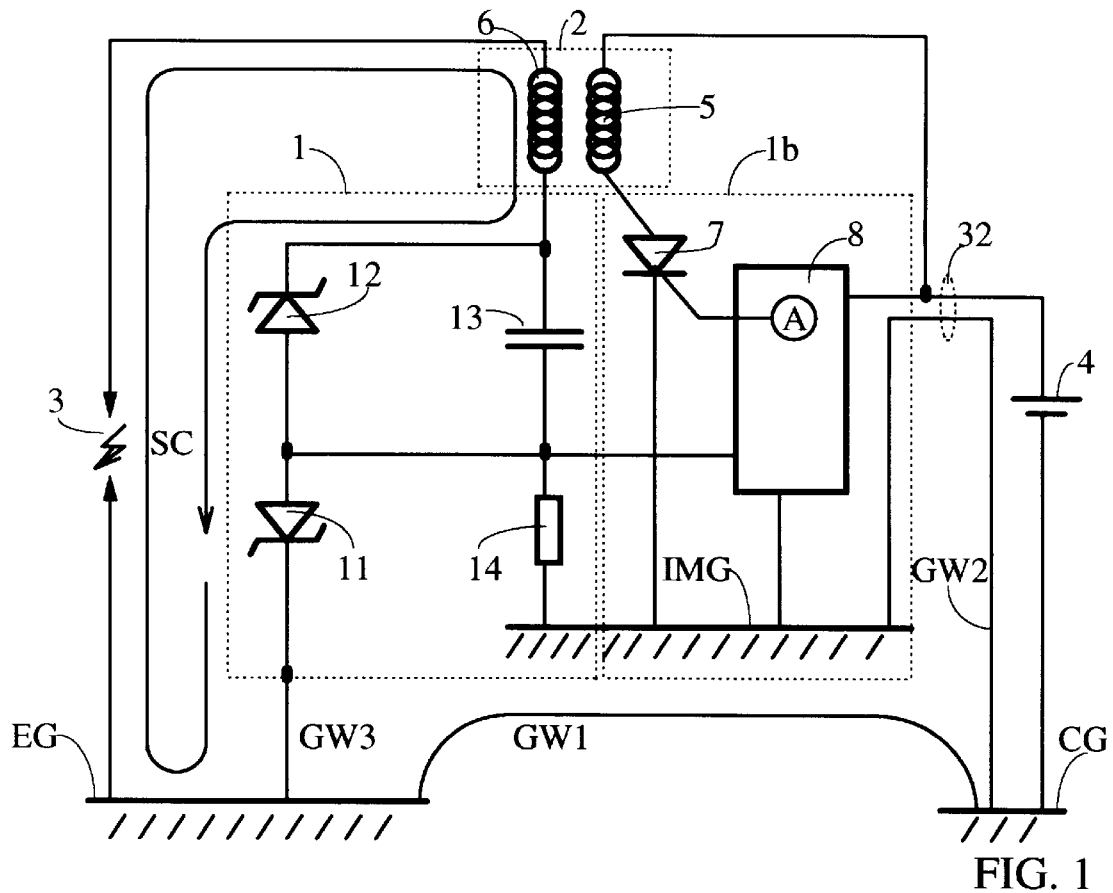
FIG. 1, shows schematically an inventive measuring circuit.

In FIG. 1 is shown a measuring circuit for sensing ionisation within the combustion chamber of a combustion engine. The measuring circuit is arranged in the grounded connection of the secondary winding 6 of an ignition coil 2. The ignition voltage is induced in the secondary winding 6 when the current through the primary winding 5 is switched off by a semi conductor switch 7. When the ignition voltage induced in the secondary winding reaches a sufficient level, then an ignition spark is generated in the spark plug gap 3. The ignition timing is controlled in a conventional manner dependent of prevailing engine parameters, such as at least engine load, rpm and temperature.

In the embodiment shown in FIG. 1 a capacitor 13 is charged by the current developed in the secondary winding 6. A zener type of diode 12 (i.e. avalanche diode) connected in parallel with the capacitor 13 will restrict charging of the capacitor to a certain voltage level. A zener diode 12 having a zener voltage, i.e. break-down voltage, in the range 50–400 Volts, preferably 80 volts, should be chosen. The capacitor 13 will act as measuring voltage source applied in the grounded connection, having a substantially constant voltage level during the course of combustion. The substantially constant voltage level will then correspond to the break down voltage of the zener diode. A measuring resistance 14 having a high order of ohmic resistance is connected in series with the capacitor 13, preferably with an ohmic resistance in the order of some 100 kOhm. In order to protect the measuring resistance from the relatively large spark current, a shunt rectifier 11, in this embodiment a zener diode, is connected in parallel with the measuring resistance 14. A conventional diode could in some applications be chosen as the shunt rectifier. A zener diode is however the preferred choice, because a zener diode also will limit any negative voltages applied over the measuring resistance 14, thus protecting the measuring circuits and logic's circuits connected to the measuring resistance. If the shunt rectifier 11 is a zener diode, then the order of the negative measuring voltage will be limited to the break-down voltage of the zener diode. The conventional zener diode exhibits a very low order of voltage drop in the order of some tenths volts in the normally conductive direction, typically in the order of 0.7 volts. When the ignition spark is generated in the spark plug gap 3, then a spark current is developed as indicated with arrow SC in a closed circuit. The shunt rectifier 11 secures that the energy induced in the secondary winding is delivered to the spark gap 3. The spark current is developed in a closed circuit from one end of the secondary winding 6 to the other end, via the zener diodes 12 and 11, the ground wire GW3, engine ground EG and finally the spark plug gap 3.

When the spark in the spark plug gap 3 goes out, then the capacitor will bias the spark plug gap with a bias voltage having an opposite polarity in relation to the spark voltage. The current subsequently developed, hereafter designated as ionisation current, is dependent upon the number of ionised particles generated from the combustion process in the spark plug gap. The ionisation current is promoted by the measuring voltage source, i.e. the capacitor 13, in a closed circuit via the secondary winding 6, the spark plug gap 3, the ground loop EG-GW1-GW2-IMG and the measuring resistance 14. The order of the ionisation current is detected by an electronic control unit 8, which control unit also could include the driver A for the semiconductor switch 7.

In accordance with the inventive design of the measuring circuit, the ground connection EG of the zener diode 11 is separated from the ground connection IMG of the measuring resistance 14. The ground connection EG of the zener diode 11 is preferably engine ground, which results in a restricted current circuit locally on the engine. The area enclosed by the current circuit, or the physical size of the circuit, will be very limited which will give a circuit which is less susceptible for interference radiated from external sources as well as suppressing emitted interference.

The ground connection of the measuring circuit could be a ground connection common with the ground connection IMG for the electronics of the ignition system. In this manner the relatively high order and interference generating ignition current could be securely conducted via a ground connection not being used by the rather sensitive electronics of the control unit 8.

With an ignition system arranged in a chassis, for example in a motor vehicle, then conventionally a battery 4 using the chassis as system ground is used. The engine is connected to chassis ground CG via a ground strap GW1. The ground connection IMG of the ignition system circuitry could then be grounded to chassis ground via an earth strap(or cable) GW2.

In order to reduce the size of the primary current circuit should the voltage supply be installed in parallel with the ground reference of the primary current circuit, the connection to the positive terminal of the battery and the return wire to ground should be installed in parallel or in a twisted dual-wire in the same wiring harness 32. The physical size of the primary current electric circuit will thus be reduced, which will reduce susceptibility for electromagnetic interference generated from external sources, and the order of interference emitted from the circuit.

Figure 2:
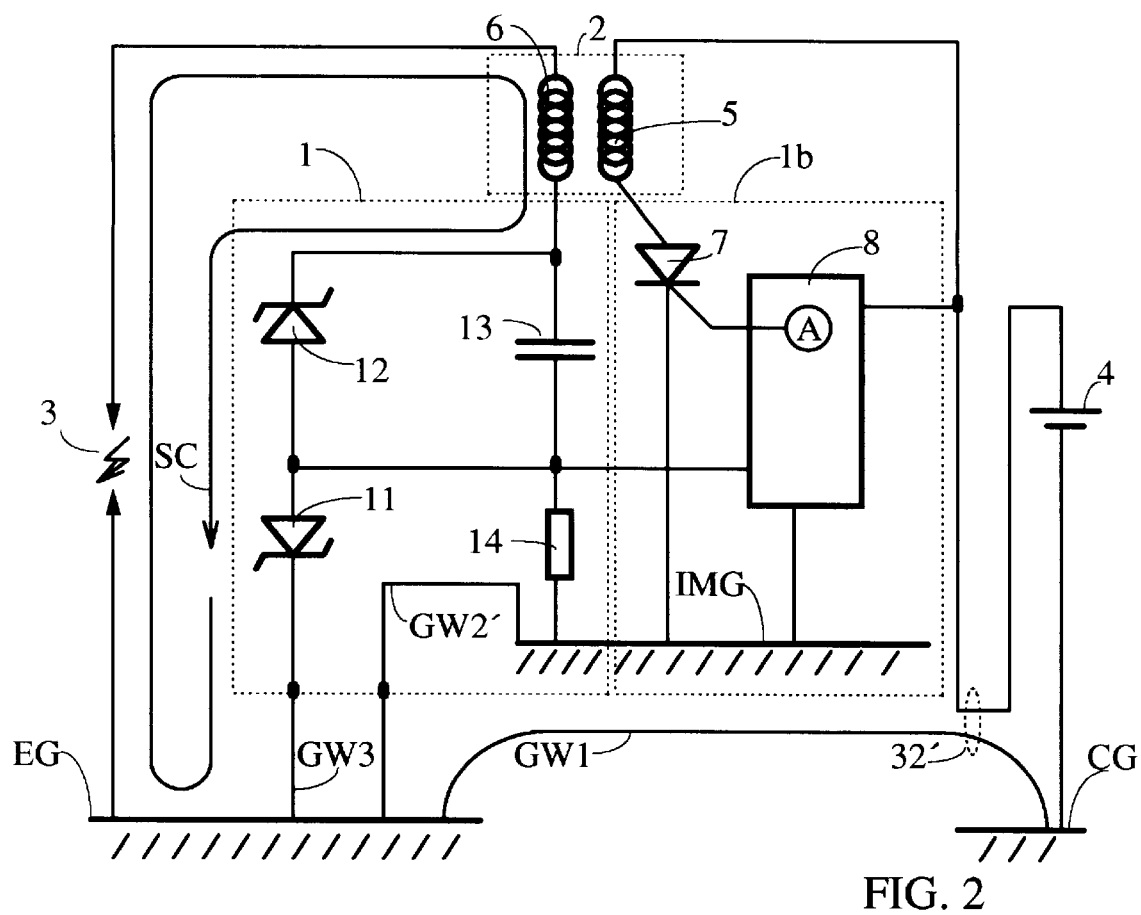
FIG. 2, shows an alternative connection of the measuring circuit to ground.

In FIG. 2 is shown an alternative means for grounding the measuring circuit. In this embodiment the ground connection IMG of the ignition system is grounded via a ground strap GW2', which is separated from the ground strap GW3 grounding the zener diode 11. Also in this embodiment the spark current SC could be conducted in a closed circuit without being conducted via the ground connection IMG of the ignition system.

Figure 3:
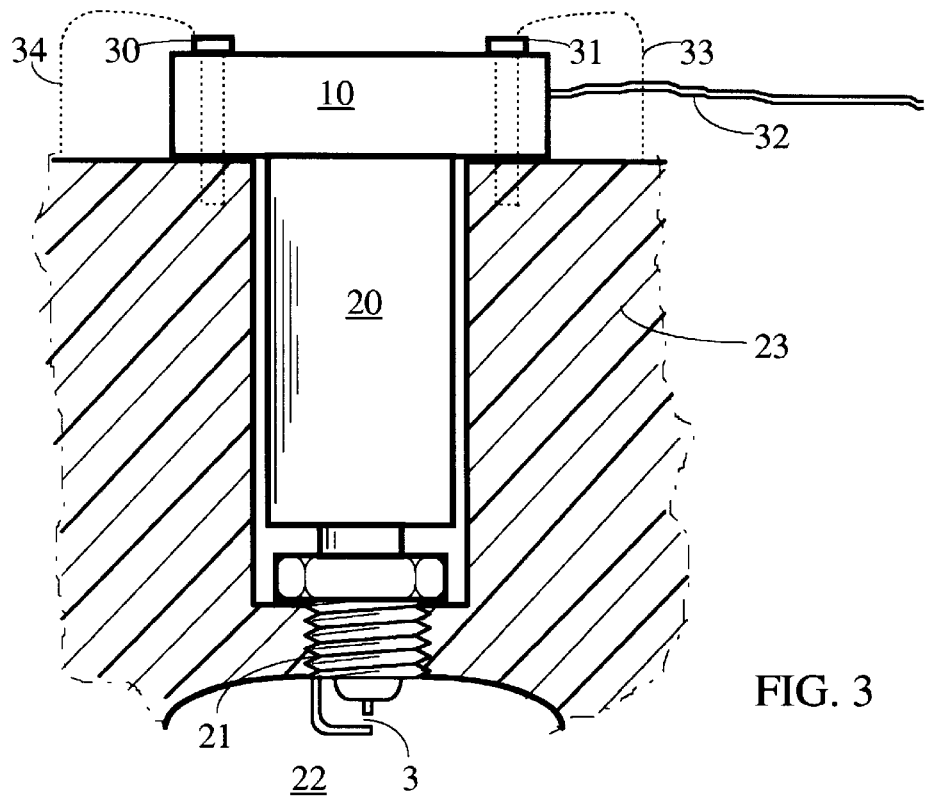
FIG. 3, shows how a measuring circuit could be integrated in an ignition coil connected directly on top of a spark plug.

In FIG. 3 is shown how a measuring circuit could be integrated with an ignition coil mounted directly on top of a spark plug 21. The ignition coil 2 is preferably arranged in a cylindrical housing 20, which housing also includes a conventional spark plug connector. The spark plug connector is preferably of a similar type of design as the connector shown in the patent EP,C,151.594 (=U.S. Pat. No. 4,621, 881). A housing including the electronic circuitry is integrated with the ignition coil housing, including the electronics of the measuring circuit 1. The individual components 11–14 of the measuring circuit are preferably mounted on a common circuit board, but having separated ground or ground connections for the zenerdiode 11 and all other components.

The integrated unit 10,20 is mounted firmly to the cylinder head 23 of the engine by means of fastening screws 30, 31.

In the first embodiment shown in FIG. 1 at least one of the fastening screws 30, 31 is used as grounding screw GW3, which directly connects the zener diode 11 ground to engine ground EG. Alternatively an additional short grounding strap 34 could be connected to the engine casing. The ignition system ground IMG is in this embodiment is connected to ground via the wiring harness 32, and then preferably to chassis ground.

In the second embodiment shown in FIG. 2 one of the fastening screws, for example screw 30, could be used as ground screw GW3 for the zener diode 11. The other fastening screw 31 could be used as grounding screw GW2' for the ignition system ground IMG. Alternatively a short ground strap 33 could be used as ground connection GW2'. If the physical size of the primary current circuit should be limited then the voltage supply in the wiring harness should be installed in parallel with the ground connection of the engine GW1, as indicated with the wiring harness 32' in FIG. 2.

The invention could be modified in a number of ways within the scope of the claims. In the most preferred embodiment the spark current as well as the primary current may be separated into two independent circuits which both are designed with a limited physical size. In this way the electronic circuitry will be protected against the high frequency content of the spark currents. By the reduction of the physical size of each circuit the susceptibility for interference emitted from other electric systems located within or outside of the vehicle will also decrease. The invention could be implemented in two-stroke, four-stroke, Wankel as well as other types of engines being equipped with ignition coils and ignition plugs for combustion initialisation.

The voltage source used for measurements could also include a DC—DC converter, which could transform the battery voltage to the voltage level necessary for measurements. The basic feature of the invention is that the spark currents should not be conducted via the ground connector used by the remaining electronics used. The ground connection for the remaining electronics could subsequently be grounded to engine ground, and in certain applications could also the primary current be conducted through engine ground. In the latter case the supply of the primary current may be installed in parallel with the ground reference if the enclosed area of the primary current circuit is to be minimised from an interference point of view.

Although the present invention has been described in relation to a particular embodiments thereof, many other variations and modifications and other uses will become apparent to those skilled in the art. It is preferred, therefore, that the present invention be limited not by the specific disclosure herein, but only by the appended claims.

We claim:

1. A measuring circuit for sensing ionization within a combustion chamber of an engine arranged in a chassis having a chassis ground, which engine includes at least one spark plug arranged in the combustion chamber, the spark plug having a first electrode and a second electrode forming a spark plug gap therebetween with the second electrode being connected to an engine ground, and an ignition system including at least one ignition coil including a primary winding and a secondary winding having a first end connected to the first electrode of the at least one spark plug and a second end connected to the engine ground to generate a spark plug current in the spark plug gap, the measuring circuit comprising:

a measuring resistance having one end connected to a measuring circuit ground plane;

a rectifying element connected in parallel with the measuring resistance and arranged to receive the spark current;

a measuring voltage source having a substantially constant voltage potential during a combustion event, the voltage source being arranged in series with the measuring resistance and the spark gap such that the measuring voltage source during ionization within the spark plug gap causes an ionization current through the measuring resistance corresponding to ionization developed in the spark plug gap;

the rectifier element in the measuring circuit being connected directly to the engine ground via a ground wire without passing through the ground plane of the measuring circuit, so that the spark current may be conducted through the rectifier element without affecting the ground plane of the measuring circuit.

2. The measuring circuit according to claim 1, wherein the ground plane of the measuring circuit is grounded to the chassis ground via a first ground strap and the engine ground is grounded to the chassis ground via a second ground strap.

3. The measuring circuit according to claim 2, wherein the ignition system includes an ignition voltage source having a ground connected to the chassis ground.

4. The measuring circuit according to claim 1, wherein the ground plane of the measuring circuit is grounded to the engine ground via a first ground strap, which is separated from and in parallel with a ground wire of the rectifier element, and the engine ground is connected to chassis ground via a second ground strap.

5. The measuring circuit according to claim 2, wherein the primary winding of the ignition coil is a part of a circuit which entirely separate from a circuit which includes the spark gap.

6. The measuring circuit according to claim 4, wherein the primary winding of the ignition coil is a part of a circuit having only the engine ground as a common conductor with the circuit which includes the spark gap.

7. The measuring circuit according to claim 3, wherein a primary current is developed in the primary winding and a wiring harness is provided to conduct the primary current to first and second terminals respectively of the ignition voltage source, the wiring harness including a supply conductor and a ground return conductor which are arranged in parallel with each other within the wiring harness.

8. The measuring circuit according to claim 2, wherein the measuring voltage source includes a capacitor and a voltage limiter.

9. The measuring circuit according to claim 8, wherein the voltage limiter is a zener diode connected in parallel with the capacitor.

10. The measuring circuit according to claim 8, wherein the measuring voltage source, the measuring resistance and the rectifier element are mounted on a common circuit board, which circuit board includes two separate ground connections, one of the ground connections being connected directly to engine ground and the other ground connection being connected to the ground plane of the measuring circuit.

11. The measuring circuit according to claim 10, wherein the circuit board includes means for sensing a voltage developed across the measuring resistance by the passage therethrough of the ionization current.

* * * * *